United States Patent [19]

Lewis, Jr.

[11] 4,041,404
[45] Aug. 9, 1977

[54] APPARATUS AND METHOD FOR DETECTING WHEN A MEASURED VARIABLE REPRESENTED BY A STRING OF DIGITAL PULSES REACHES A PLATEAU

[75] Inventor: Ronald Cyril Lewis, Jr., Willow Grove, Pa.

[73] Assignee: Leeds & Northrup Company, North Wales, Pa.

[21] Appl. No.: 691,687

[22] Filed: June 1, 1976

[51] Int. Cl.[2] .................. H03K 5/153; H03K 5/18
[52] U.S. Cl. ........................... 328/150; 307/350; 307/351; 307/358; 328/114; 328/132; 328/135
[58] Field of Search ............ 328/44, 114–116, 328/132, 135, 130, 150; 307/235 R, 235 A, 235 J; 324/99 D, 111; 340/347 NT

[56] References Cited

U.S. PATENT DOCUMENTS

| | | |
|---|---|---|
| 3,746,982 | 7/1973 | Allington et al. .......... 328/114 X |
| 3,961,272 | 6/1976 | Witriol et al. ................ 328/44 X |

Primary Examiner—John Zazworsky
Attorney, Agent, or Firm—William G. Miller, Jr.; Raymond F. MacKay

[57] ABSTRACT

A method for detecting a plateau for a measured variable by comparing the clock pulses from a dual slope analog to digital converter which are counted during consecutive pairs of conversions. The counter is decremented during the first conversion and incremented during the second. If the counts are detected as being identical within a prescribed number of counts an accumulator is incremented. A predetermined number of successive increments of the accumulator indicates a plateau. The accumulator is cleared whenever the counts of a pair of conversions are not within the window.

6 Claims, 7 Drawing Figures

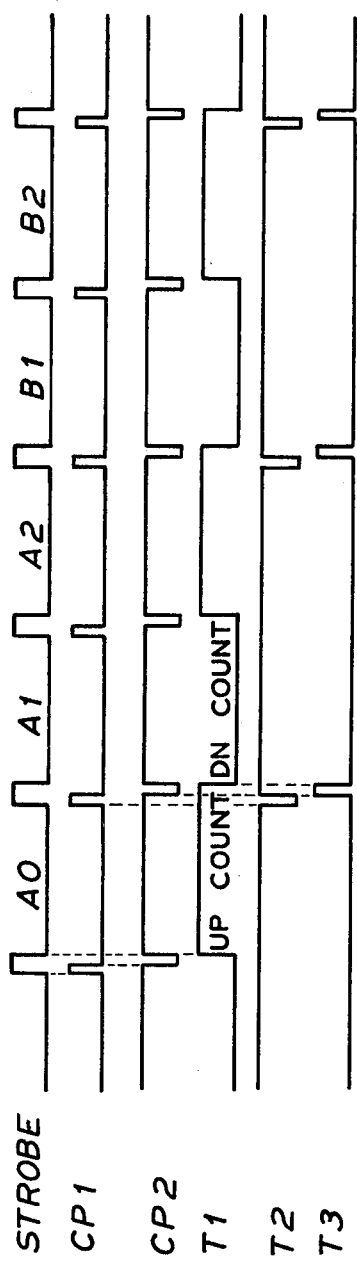
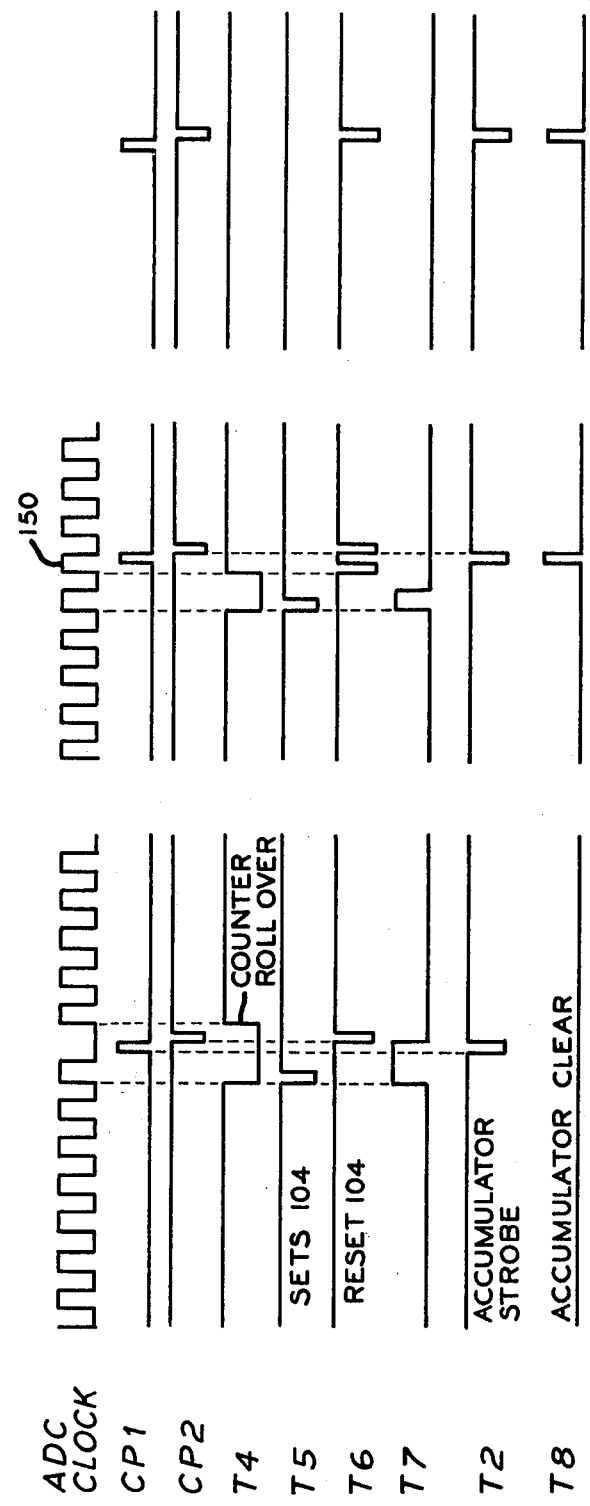
FIG. 4
FIG. 5
FIG. 6
FIG. 7

APPARATUS AND METHOD FOR DETECTING WHEN A MEASURED VARIABLE REPRESENTED BY A STRING OF DIGITAL PULSES REACHES A PLATEAU

BACKGROUND OF THE INVENTION

This invention relates to a method and apparatus for detecting when the value of a measured variable has reached a plateau or, in other words, has reached a value which remains substantially constant over a period of time. The apparatus and method deals specifically with the detecting of the plateau when the measured variable is represented by a periodically produced string of pulses wherein the pulse count of the string is representative of the value of the measured variable. An example of the type of application in which a plateau detecting circuit can be used is the temperature measurement of steel in a refining furnace as, for example, by the use of the well known expendable thermocouples which are immersed in the steel bath for the purpose of making a single temperature measurement of the bath.

Prior art devices known to the inventor have usually included electromechanical elements and have not been capable of detecting the plateau when the variable is represented by a digital signal comprised of a string of pulses whose pulse count represents the value of the variable.

SUMMARY OF THE INVENTION

The method of this invention involves detecting when the value of a measured variable has reached a plateau. The variable itself is represented by a periodically produced string of pulses having a pulse count representative of the value of the variable. A number of apparatus elements is required to carry out this method. One of those elements is a first counting means operable to count consecutive pairs of pulse strings so that the consecutive counts are in opposite directions. There is also required a second counting means and a means responsive to the output of the first counting means at the end of each pair of pulse strings and operable to increment the second counting means when the count accumulated by the first counting means at the end of the second string of said pair is within a predetermined number of counts of the count existing before counting the first string of the pair and to clear said second counting means when the count is not within the predetermined number. The accumulation of a predetermined number of counts in the second counter is then indicative of the fact that said measured variable has reached a plateau.

BRIEF DESCRIPTION OF THE DRAWINGS

In the drawings:

FIG. 4 is a timing diagram showing the relative timing of some of the signals in the circuit of FIG. 3.

FIG. 5 is another timing diagram showing the relationship of some of the signals in the circuit of FIG. 3.

FIG. 6 is a timing diagram showing the relationship of some of the signals of the circuit in FIG. 3 under conditions different from those for FIG. 5.

FIG. 7 is a timing diagram showing the relationship of certain signals of the circuit of FIG. 3 under different conditions than those set forth for FIGS. 5 and 6.

DESCRIPTION OF THE PREFERRED EMBODIMENT

Figure 1:
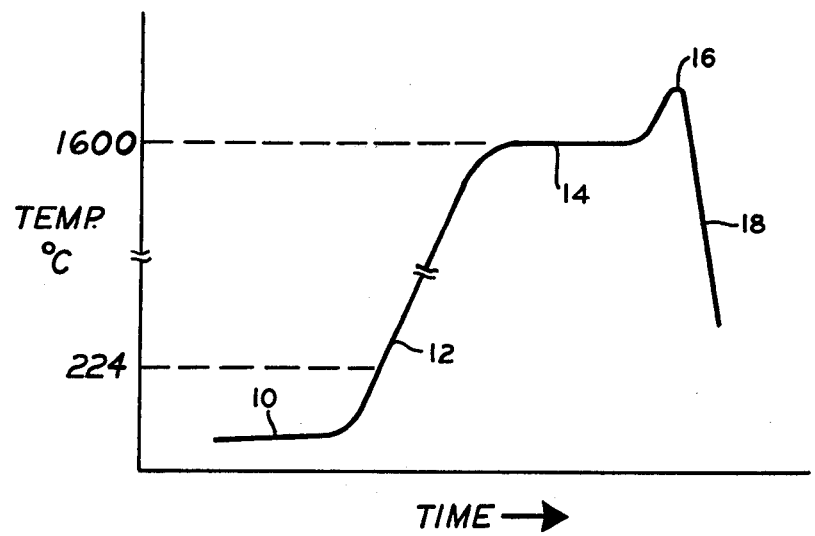
FIG. 1 is a graphical representation of the change in temperature with time detected when an immersion thermocouple of the expendable type is inserted in a steel bath.

The manner in which the detected temperature changes with time when an immersion thermocouple is inserted into the steel bath in an open hearth furnace may be conveniently illustrated in graphical form, as shown in FIG. 1. That curve shows the thermocouple responding to the ambient temperature in the region 10 prior to its immersion into the steel bath. As will be evident from FIG. 1, once immersion occurs the response of the detector is such that the voltage from the detector, which is proportional to the temperature detected, rises sharply as in region 12 to a plateau value along that part of the curve shown as 14 where over a period of time the output of the detector does not change substantially and is indicative of the temperature of the steel bath, which may for purposes of illustration be assumed to be 1,600° C. As is normal practice, the immersion thermocouple may then be withdrawn from the bath and the temperature detected may rise to a peak 16 as the detector moves through the layer of slag during withdrawal. After the detector has been withdrawn from the bath it cools along the curve of FIG. 1 as shown in the region 18.

Figure 2:
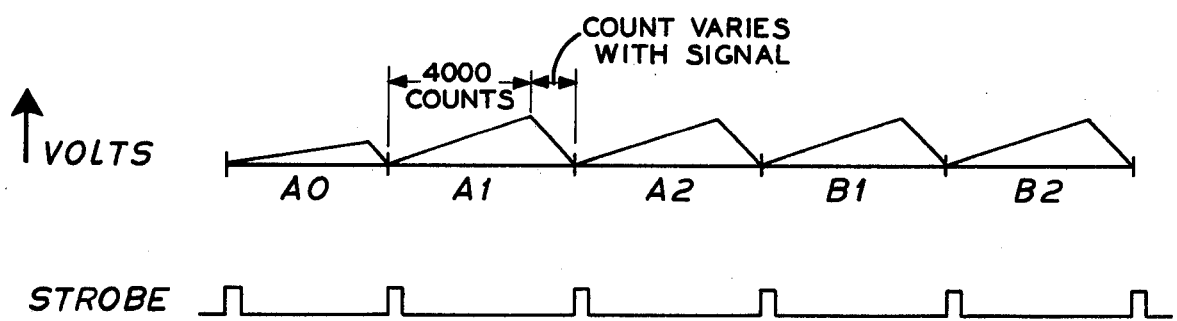
FIG. 2 is a timing digaram illustrating the operation of a typical dual slope analog-to-digital converter.

The temperature measurement referred to above is normally one which provides an analog voltage signal which is, for the purpose of this description, considered to be proportional to the temperature being detected. It is necessary to convert that analog signal to a digital signal. This may be advantageously done by any dual slope analog-to-digital converter, for example. One form of such converter is described in U.S. Pat. No. 3,826,983 issued to Garratt et al on July 30, 1974. Such converters utilize clock pulses for their operation and produce a strobe pulse at the end of each conversion. The conversions are made sequentially and the output of the converter during each conversion is a string of pulses whose number is indicative of the value of the analog signal being converted. This may be illustrated by reference to FIG. 2 where there is shown graphically five sequential conversions with the abscissa being time and the ordinate representing the magnitude of the potential reached by the integrator output in the dual slope converter. During the first conversion, for example, namely the conversion AO, the input part of the cycle occurs first. During that part of the cycle an integrating circuit has its input connected to the measured variable and the output of the integrator will increase at a rate proportional to the value of the measured variable until a fixed number of clock pulses have been counted. In the example of FIG. 2 it is assumed that the fixed number of clock pulses will be 4,000 counts so that the output of the integrator at the end of the 4,000 count is related to the value of the analog signal being converted. The converter circuit then goes through the reference period of the cycle wherein a reference voltage is applied to the integrator circuit in a polarityopposite that of the measured variable so that the output of the integrator circuit decreases toward zero. The number of clock pulses which occur between the beginning of the reference period and its end, namely when the output of the integrating circuit reaches zero, will then represent the magnitude of the analog signal being converted. Upon detecting that the integrator output has reached zero a strobe pulse is produced. That will, of course, occur at the end of the conversion cycle of the analog-to-digital converter. The strobe pulse can initiate a readout of the pulse count and initiate the subsequent conversion cycle.

It will be evident that a count of the number of pulses of the clock which occur between the strobe pulses will be related to the analog value of the signal being measured in that it will consist of the initial 4,000 counts plus a count which varies directly with the analog value being converted.

In FIG. 2 there is shown a series of five conversions, namely AO, A1, A2, B1 and B2 which are graphically illustrated as representing a value for the analog signal which is low for AO, but which does not vary during the other conversion cycles and consequently could be considered as indicative of the fact that the measured value has reached a plateau.

Figure 3:
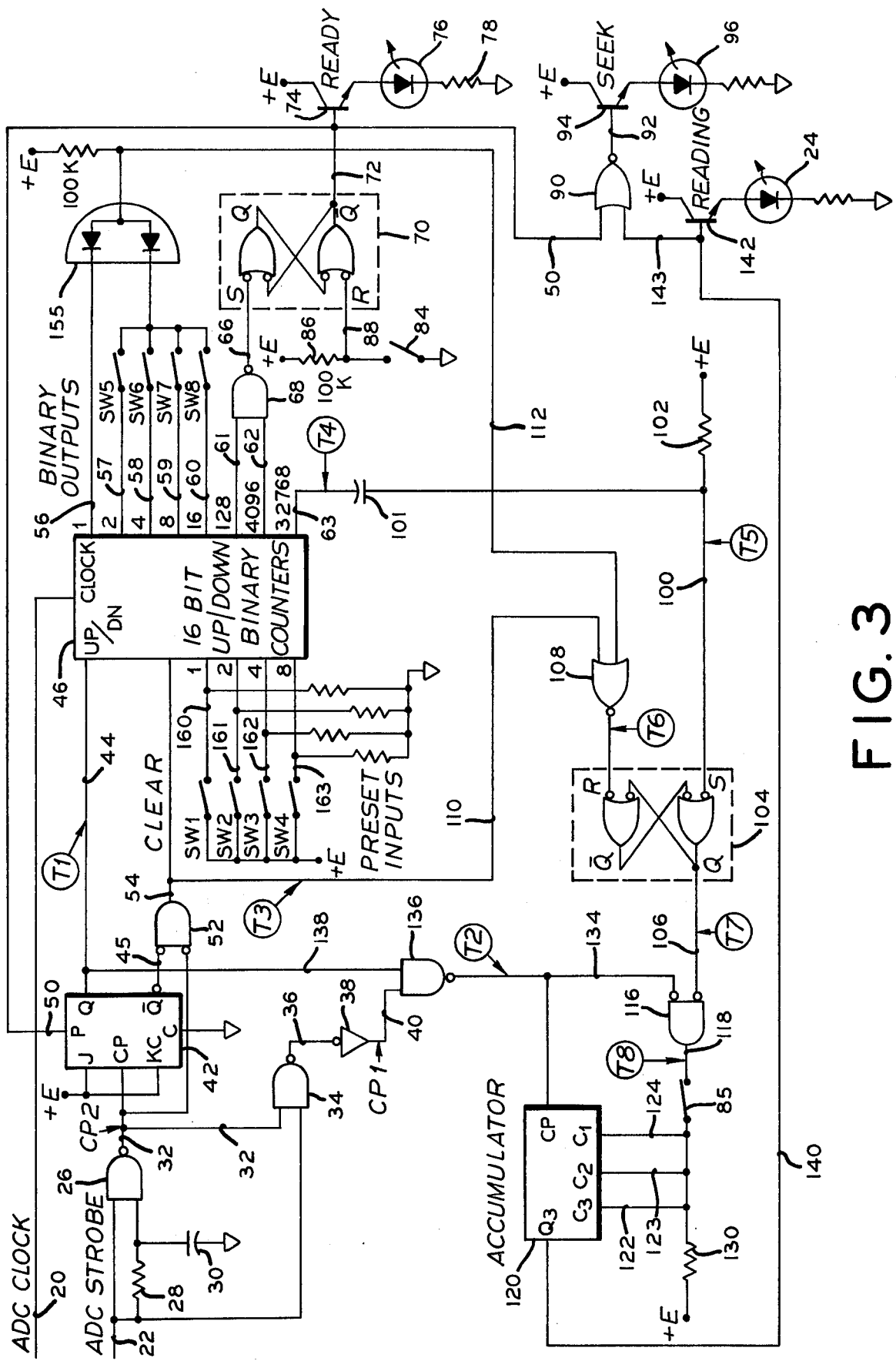
FIG. 3 is a circuit diagram partially in block diagram form showing one form of circuit which can be utilized.

In FIG. 3 there is shown a circuit diagram which utilizes the clock pulses and the stroke pulse from the analog-to-digital converter previously mentioned and provides an indication that the analog signal as represented by the string of pulses produced in response to each conversion has not changed more than a predetermined amount over the predetermined number of conversions, thus indicating that a plateau has been reached for the value of the analog signal.

In FIG. 3 the clock pulses from the analog-to-digital converter are introduced on line 20 whereas the strobe pulses are introduced on line 22 with the circuit providing an indication of the reaching of a plateau by causing the light emitting diode 24 to emit light.

The strobe pulses introduced at line 22 are broken down to produce a two phase clock for operating the circuit of FIG. 3, the first clock pulse, CP1, serves to clear an accumulator circuit whenever the pulse counts of a pair of conversions are not within the desired tolerance, as will be described, while the second pulse, CP2, clears the main counter for the start of a down count or a decrement of the counters at the beginning of a pair of conversions to be compared, as will also be described.

The strobe pulse on line 22 is introduced as one input to the NAND gate 26. The other input is derived from a series circuit including a resistor 28 and a capacitor 30 with the input being taken from the junction between the resistor and capacitor so as to provide a slight delay in the second input to the gate 26. When both inputs to the gate 26 are "high" the output of the gate is "low", thus providing the negative going clock pulse, CP2, on line 32.

When the signal on line 22 is "high" and the signal on line 32 is "high", as when the clock pulse CP2 is not present, then the output of an NAND gate 34 is "low". That output on line 36 provides an input to the signal inverter 38 whose output on line 40 will go "high" in response to the signal on line 36 going "low". There is thus produced the positive going clock pulse CP1 on line 40.

Both the clock pulses CP1 and CP2 and the strobe pulses on line 22 are shown graphically in the timing diagram of FIG. 4, which shows that each strobe pulse on line 22 produces initially a clock pulse CP1 on line 40 and a slightly delayed clock pulse CP2 on line 32.

The clock pulse CP2 is effective to change the state of the flip-flop 42 when the preset input from line 50 is "low" and thereby change the level of the signal on line 44, namely the signal T1, which determines whether a first counting means such as the UP-DOWN counter 46 counts in an UP or DOWN direction. Flip-flop 42 may be a 4027 CMOS integrated circuit, for example.

In the circuit of FIG. 3 the preset input of flip-flop 42 is "high" when the temperature being measured in low thus causing the signal T1 on line 44 to be "high" and the counter 46 to count in an UP direction. A "high" signal on line 50 holds T1 "high" until the signal on line 50 goes "low" after which time the flip-flop changes its state in synchronism with the clock pulse CP2 to cause the counter 46 to alternately count in a DOWN and UP direction. Thus each pair of conversions consists of a DOWN count followed by an UP count.

The flip-flop 42 has its inputs J and K held at +E volts as showm in the diagram and its clear input C is held at gound potential.

The inverted output Q from the flip-flop 42 is introduced as one input to the NAND gate 52 while the other input is derived from line 32 and corresponds with the clock pulse CP2. When the Q output of the flip-flop 42 is "low" and the clock pulse CP2 occurs the output signal T3 provides a positive pulse on line 54 from the gate 52. That pulse serves by virtue of its connection to counter 46 to clear the counter.

The counter 46, which may be a series of 4029 CMOS integrated circuits, is shown as having output line 56–63 which respectively represent when those lines are high, binary outputs corresponding to the decimal numbers 1, 2, 4, 8, 16, 128, 4,096 and 32,768, respectively. The preset inputs 1, 2, 4, 8, on lines 160–163 are utilized as will be explained later. All other preset inputs are tied low.

If, for example, the temperature of the thermocouple measuring the steel bath, as referred to in connection with FIG. 1, is below 224° C. at the beginning of conversion Ao, as shown in FIG. 4, it will be evident that counter 46 will count up from zero and will initially count the 4,000 counts during the reference period of conversion Ao. The counter will then count a number of counts depending upon the magnitude of the temperature being measured. If we assume that the temperature is below 224° C. the output lines 61 and 62 of counter 46 will not both go "high" during the UP count and the output of NAND gate 68 will stay "high". Also, the output on line 72 to the base of NPN transistor 74 will stay high to cause light emitting diode 76 to be on indicating that the circuit is ready to seek a pair. On the other hand, if we assume that the temperature was equal to at least 224° C, the total count of the counter 46 would then be such that at one time during the count both lines 61 and 62 would go "high" indicating a total count of 4,224 pulse corresponding to a temperature of 224° C as measured by the thermocouple and convered by the analog-to-digital converter.

When both the line 61 and 62 go "high" they cause a "low" signal on the output line 66 of the NAND gate 68 which has lines 61 and 62 as its two input lines. When line 66 is "low" it will cause a resetting of R-S latch 70 to produce on line 72 a "low" signal. That "low" signal will cause the base of the NPN transistor 74 to go "low", making the transistor nonconductive so as to turn off the light emitting diode 76. As shown in the circuit of FIG. 3, the collector of transistor 74 is connected to voltage source +E while the emitter is connected through the light emitting diode and resistor 78 to ground. The light emitting diode 76 is normally turned on when the circuit of FIG. 3 is reset to make the circuit "ready" for a temperature measurement. The resetting is accomplished by closing switch 84 and opening switch 85. When switch 84 is closed a "low" signal appears on reset line 88 of R-S latch 70. This low signal is produced by the resetting circuit which consists of the series connection of switch 84 and a resistor 86 which are connected between the voltage supply +E and ground so that when the switch is closed the signal on line 88 goes "low".

The R-S latch 70 is shown as being made up of interconnected gates 80 and 82, each of which produces a "high" signal on its output when there is a "low" signal at either of its inputs. When the output signal of the R-S latch 70 on line 72 goes "low", turning off transistor 74 and the light emitting diode 76 both of the inputs of NOR gate 90 will be low and the output of the gate 90 on line 92 will be "high" to turn on transistor 94 and pass current through light emitting diode 96 to indicate that the circuit is seeking a plateau, or in other words that the temperature has exceeded 224° C.

The transistor 94 is connected to diode 96 in the same way as mentioned for transistor 74 and diode 76.

As will be evident from FIG. 3, whenever the reset output on line 72 is "low" the signal on line 50 will be "low" and hence the flip-flop 42 will provide an output signal on line 44, namely T1, which is "low" and therefore the counter 46 will thereafter proceed to count down or decrement in response to clock pulses from line 20. Thus, once the temperature has exceeded 224° C the R-S latch 70 is reset and the next count by counter 46, as for conversion number A1, will be a down count.

If we assume that the temperature being measured is, for example, at 1600° C which as shown in FIG. 1 as a plateau level, then the counter 46 will count down from zero 5,600 pulses. Then at the end of the down count flip-flop 42 will cause the signal T1 to go high and the counter will then subsequently increment during the next conversion A2. If, for example, the temperature has not changed the counter 46 will roll over at the end of the UP count causing the signal on line 63, namely T4 to go "low" as shown in FIG. 5.

When the signal T4 goes "low" the normally "high" signal T5 on line 100 also goes "low" and stays low until capacitor 101 is charged. The signal T5 was normally held high by the positive potential +E applied to resistor 102 whose other end is connected to line 100. Line 100 provides the set input, namely signal T5, to the R-S latch 104. The R-S latch 104 is constructed similarly to R-S latch 70 and hence it consists of a pair of gates appropriately interconnected. Thus a low input signal T5 on the set input will cause the output on line 106, namely signal T7 to go "high". It will be evident that at the time the set input T5 goes "low" that the reset input T6 will be "high" in that the input signals to the NOR gate 108, namely the signals T3 on line 110 and the signal on line 112 will both be "low".

The "high" signal T7 on line 106 will assure that the output of the gate 116 on line 118, namely signal T8 will be low so that the second counter forming accumulator 120 will not be cleared in that the clear inputs supplied on lines 122, 123 and 124 to the terminals C3, C2, and C1, respectively, of the three stage counter making up accumulator 120 will receive no positive clear pulses. As shown in FIG. 3, line 118 is connected through normally closed switch 85 to the lines 122-124 and to one side of a resistor 130 whose other side is connected to a positive potential +E so that the lines 122-124 are maintained low whenever the signal on line 118 is low. However, whenever the signal on line 118 goes high or whenever the switch 85 is disconnected lines 122-124 go high and the accumulator is cleared. The switch 85 is operated, of course, only when the circuit is being reset, that is simultaneously with the operation of switch 84 as previously mentioned.

The signal on line 118 will go high causing a resetting of the accumulator whenever a low input is supplied to gate 116 on both lines 106 and 134 which carries signals T7 and T2, respectively.

It will be evident from the circuit of FIG. 3 that the signal T2 is normally high and provides a negative going accumulator strobe pulse whenever the inputs to the gate 136 are both high, namely whenever the clock pulse CP1 on line 40 is present simultaneously with a high signal T1 on line 138, which is present whenever the counter 46 is in the UP count mode. Thus, the accumulator 120 is incremented by the clock pulse CP1 whenever the counter 46 is in an UP count mode. Thus, the accumulator strobe pulse T2 is applied to the clock pulse input CP of accumulator 120 at the end of every second conversion as shown in FIG. 4.

It will be evident that if the accumulator is strobed by a pulse T2 four successive times without the accumulator having been cleared then there will be an output from the accumulator on line 140, namely a high signal which will cause the transistor 142 to be conductive thus causing the light emitting diode 24 to indicate that a plateau has been reached and a reading should be taken of the output of the analog-to-digital converter. Alternatively, of course, the current flowing through transistor 142 may be utilized in a circuit which will cause the analog-to-digital converter to be stopped thus preserving the count indicating the magnitude of the plateau temperature.

As shown in FIG. 3, the transistor 142 and the light emitting diode 24 are connected in a circuit similar to that for transistor 74 and light emitting diode 76.

The presence of the "high" signal on line 140 causes a high signal to also appear on line 143 as one of the inputs to the NOR gate 90. That will cause the signal on line 92 to go low thus turning off transistor 94 and extinguishing the light emitting diode 96.

The timing diagram of FIG. 6 shows the time relationship between the signals whenever the second of a pair of conversions to be compared includes a higher pulse count than the first conversion. The additional clock pulse counted by the counter 46, as for example clock pulse 150, will cause line 56 to go high at the end of the UP count in the pair of conversions being compared. When line 56 goes high, line 112 will also go high if none of the switches SW-5 -SW-8 is closed. This causes a resetting pulse T6 to occur to reset the R-S latch 104 causing line 106 to go low at the same time that the negative going accumulator strobe pulse appears on line 134. The result is that the output of gate 116 is high and the accumulator 120 is cleared by the clear signal pulse T8. Since the accumulator is cleared by the pulse T8 subsequent comparisons of consecutive conversions will have to be such that there are four consecutive comparisons which indicate that the corresponding eight consecutive conversions are equal before a plateau is indicated by a high signal output from accumulator 120. As shown in FIG. 6, the occurrence of the additional clock pulse 150 also causes an early reset of the R-S latch 104 since a resetting pulse T6 occurs in response to the line 56 going high and then later also in response to the occurrence of the clock pulse CP2 when the line 45 is low as is the case during an UP count of counter 46, namely when there is a high signal on line 44.

FIG. 7 is a timing diagram showing the relative timing of the signals when the count of the first conversion of a pair of conversions to be compared is greater than the second counts of that pair. In such a case the counter 46 does not roll over and therefore there is no negative going pulse signal appearing on line T4. The accumulator is cleared by the apearance of a positive pulse signal on line T8 as a result of the signal pulse T2 which is negative going and coincident with a "low" signal T7 resulting from the resetting of the R-S latch 104 upon occurrence of the timing pulse CP2 at the end of the UP count of counter 46.

Since it is desirable to detect plateaus over which the temperature measurement varies slightly as well as those plateaus over which there is no variation, it is necessary to establish a window of a certain number of counts which will allow the circuit to indicate a good comparision between consecutive conversions when the counts differ by no more than a predetermined number. For example, if it is desired that the second conversion can be less than or exceed the first conversion of by one count, then switches SW-1 and SW-5 are closed so that the line 112 will not go high until more than one additional count has occurred or more than one count has been missing during the second conversion of a pair. As shown in FIG. 3, the switch SW-5 connects line 57 to the cathode of one of a pair of diodes incorporated in the gate 155. The other output lines 58, 59 and 60 are likewise selectively connected by switches SW-6, SW-7 and SW-8, respectively, to the cathode of the same diode and provide in accordance with their selective actuation a number of different circuit arrangements which will allow in connection with the selective actuation of appropriate switch SW-1 − SW -4 an excess of deficiency of different selected numbers of pulses during the second conversion of a pair of conversions when compared with the first conversion.

The switches SW-1 - SW-4 are shown as providing for the connection of a +E potential selectively to the presetting input line 160-163 which selectively represent binary inputs of 1, 2, 4 and 8. The lines 160-163 are each connected through a resistor to ground so that when one of the switches SW-1 - SW-4 is closed the appropriate input line receives a high signal which jams an input into the counter 46. For example, if switch SW-2 is closed line 161 will go high and a count of two will be jammed into the counter 46 so that when a DOWN count occurs it will start at a point which would normally be reached only after counting two pulses. Thus, the counter 46 will roll over two counts earlier than it would otherwise and a good comparison between consecutive conversions will be indicated even when the second conversion is short by two counts. The second conversion can also be long by two counts if SW-6 is closed since line 112 would not go high and accumulator 120 would not be reset unless both line 58 and 56 were high.

It will be evident that by using the switches SW-1 - SW-8 various size windows can be obtained, some of which are indicated by the table set forth below:

| Window | Switches SW | | | | | | | |
|---|---|---|---|---|---|---|---|---|
| | 1 | 2 | 3 | 4 | 5 | 6 | 7 | 8 |
| ± 0 | | | | | | | | |
| ± 1 | x | | | | x | | | |
| ± 2 | | x | | | | x | | |
| ± 4 | | | x | | | | x | |
| ± 8 | | | | x | | | | x |

When the presetting switches SW-1 -Sw-4 only are used and the switches SW-5 - SW-8 are left open it is possible to establish a predetermined negative slope for the temperature measurements to be identified as a plateau. Thus as used in this specification a "plateau" may mean a series of measurements within a predetermined window or a series of measurements producing a curve having a predetermined slope.

SUMMARY

The operation of the circuit of FIG. 3 may be summarized as set forth below.

Switches 84 and 85 are respectively closed and opened respectively to reset the circuit of FIG. 3 so that the R-S latch 70 is reset and the accumulator 120 is cleared. At the end of each analog-to-digital conversion the strobe pulse appearing on line 22 is effective to cause the counter 46 to begin a new count of the clock pulses from line 20. That count will be an UP count as long as the temperature being measured is below 224° C, for example. Upon the temperature reaching 224° C the R-S latch 70 is set and the "ready" light from diode 76 which was lit upon resetting the circuit of FIG. 3 is extinguished and the "seek" light from diode 96 is lit indicating that the circuit is seeking a plateau. As the temperature being measured constantly increases toward a plateau, as shown in FIG. 1 in the region 12, each of the analog-to-digital conversions will have an increased count when compared with its previous one and therefore after each of those conversions there will be a resetting of R-S latch 104 to cause a clearing of accumulator 120.

After the temperature has reached 224° the flip-flop 42 will cause the counter 46 to alternate its count so that the counter 46 will first count down and will then count up for pairs of consecutive ADC coversions. When the UP count exceeds the DOWN count of the previous conversions, as will be the case in the region 12 of FIG. 1, then there will always be a resetting of R-S latch 104 as a result of the fact that the gate 155 will not be conductive.

Depending upon the magnitude of the window established by the closing of the switches SW-1 through SW-8, a plateau will be indicated whenever there are four consecutive pairs of conversions within the established window so as to produce an output from the four-bit counter which comprises accumulator 120 to light up the diode 24 indicating that a reading is available of the plateau magnitude. Whenever the count of any pair of conversions is not within the established window the gate 155 is non-conductive and R-S latch 104 is reset indicating a bad comparision. The result is then a clearing of the accumulator 120 making it necessary that subsequent pairs of conversions match within the tolerances of the window established for four consecutive pairs of conversions in order that a plateau will be indicated.

What is claimed is:

1. Apparatus for detecting when the value of a measured variable has reached a plateau when that value is represented by periodically produced strings of pulses having pulse counts representative of the value, comprising;
 a first counting means operable to count consecutive pairs of said pulse strings so that the consecutive counts are in opposite directions,
 a second counting means, and
 means responsive to the output of said first counting means at the end of each pair of pulse strings and operable to increment said second counting means when the count accumulated by said first counting means at the end of the second string of said pair is within a predetermined number of counts of the count existing before counting the first string of the pair and to clear said second counting means when the count is not within the predetermined number, whereby the accumulation of a predetermined number of counts in said second counter is indicative of said measured variable reaching a plateau.

2. Apparatus as set forth in claim 1 in which said first counter is operative to count down when counting the first pulse string of each pair.

3. Apparatus as set forth in claim 1 in which said first counting means includes means for setting said predetermined number of counts by which the first pulse string can differ from said second pulse string before said first counter fails to increment said second counter.

4. A method for detecting when the value of a measured variable has reached a plateau when that value is represented by periodically produced strings of pulses having pulse counts representative of the value, comprising the steps of
 counting consecutive pulse trains in opposite directions.
 producing a signal at the end of the second pulse train of each pair of pulse trains when the count of the second pulse train is within a predetermined number of counts with respect to the count of the first pulse train of the pair,
 counting the number of consecutive signals produced, and
 indicating a plateau has been reached when the count of the number of consecutive signals reaches a predetermined value.

5. Apparatus for detecting when the value of a variable supplied as an input to a dual slope analog-to-digital converter is at a plateau value, comprising;
 a first counting means operable to count the clock pulses over the full conversion cycle of the converter,
 means for clearing said first counter in response to alternate strobe pulses from said analog-to-digital converter,
 means for operating said first counter to count UP until the variable supplied reaches a minimum value after which the direction of count is alternated such that over separate pairs of conversions a DOWN count of the clock pulses precedes an UP count of those pulses,
 a second counter,
 means responsive to a roll-over of said first counter at the end of a pair of conversions to increment the second counter and responsive to an overflow or underflow of said first counter with respect to roll-over beyond a preset number of pulses to reset said second counter,
 means responsive to a full count on said second counter to indicate a plateau has been reached by said value.

6. a digital plateau detecting device for use with an analog to digital converter having a conversion period and producing in each of said conversion periods a pulse train representative of the value of a measured variable with successive pulse being representative of successive values of said measured variable, comprising;
 a bidirectional pulse counter which counts the pulses of said pulse train and is cleared at the beginning of each conversion period,
 means for controlling said bidirectional counter to count the pulses during the first of each consecutive pair of conversions in one direction starting from a clear state and for counting the pulses during a second conversion in the other direction starting from the state of the counter existing after the count from the first conversion,
 a flip-flop,
 means responsive to the state of said counter after the second of each consecutive pair of conversions when said counter has returned to the state within a predetermined count of the state existing prior to said first count for producing a set signal,
 means responsive to the state of said counter after said second conversion when said counter has been returned to a state indicating at least a predetermined inequality between the count during said first conversion and the count during said second conversion for producing a reset signal to said flip-flop, and
 a counter connected to the output of said flip-flop and operative to be incremented in response to each of said set signals and to be cleared in response to each of said reset signals, whereby the accumulation of a predetermined count indicates a plateau.

* * * * *